United States Patent
Sadwick et al.

(10) Patent No.: US 7,504,039 B2
(45) Date of Patent: Mar. 17, 2009

(54) METHOD OF MICRO-FABRICATION OF A HELICAL SLOW WAVE STRUCTURE USING PHOTO-RESIST PROCESSES

(75) Inventors: Laurence P. Sadwick, Salt Lake City, UT (US); Jehn-Huar Chern, Salt Lake City, UT (US); Ruey-Jen Hwu, Salt Lake City, UT (US); Jishi Ren, Kanata (CA); Ding Wu, Salt Lake City, UT (US); Ching-Hsi Lin, Salt Lake City, UT (US)

(73) Assignee: Innosys, Inc., Salt Lake City, UT (US)

( * ) Notice: Subject to any disclaimer, the term of this patent is extended or adjusted under 35 U.S.C. 154(b) by 707 days.

(21) Appl. No.: 10/941,237

(22) Filed: Sep. 15, 2004

(65) Prior Publication Data

US 2006/0057504 A1    Mar. 16, 2006

(51) Int. Cl.
*B44C 1/22*    (2006.01)
(52) U.S. Cl. .......................... 216/48; 29/800
(58) Field of Classification Search .......... 216/41, 216/44, 48; 29/600
See application file for complete search history.

(56) References Cited

U.S. PATENT DOCUMENTS

| | | | |
|---|---|---|---|
| 4,237,402 A | 12/1980 | Karp | |
| 4,371,854 A | 2/1983 | Cohn et al. | |
| 4,409,518 A | 10/1983 | Karp et al. | |
| 4,409,519 A | 10/1983 | Karp | |
| 4,429,255 A | 1/1984 | Pasmannik et al. | |
| 4,558,256 A | 12/1985 | Karp | |
| 4,689,276 A | 8/1987 | Jacquez | |
| 4,792,654 A | 12/1988 | Trujillo | |
| 4,831,335 A | 5/1989 | Wheeland et al. | |
| 4,855,644 A | 8/1989 | Orui et al. | |
| 4,866,343 A | 9/1989 | James | |
| 5,112,438 A | 5/1992 | Bowers | |
| 5,363,016 A | 11/1994 | James | |
| 6,465,958 B1 | 10/2002 | Wilcox et al. | |
| 6,584,675 B1 | 7/2003 | Rajan et al. | |
| 6,593,695 B2 | 7/2003 | Theiss | |
| 6,747,412 B2 | 6/2004 | Vancil | |
| 2003/0151366 A1 | 8/2003 | Dayton, Jr. | |

FOREIGN PATENT DOCUMENTS

WO    WO 89/11754    11/1989

OTHER PUBLICATIONS

"www.mse.vt.edu/faculty/hendricks/mse4206/projects98/group09/liga.htm"—web page titled *LIGA Fabrication*, dated Jul. 26, 2004.

*Primary Examiner*—Benny T. Lee

(57) ABSTRACT

Embodiments of the present invention include helical, ring bar and tunnel ladder slow wave structures (SWSs). Embodiments of methods of micro-fabricating such SWSs are also disclosed. Embodiments of high frequency electromagnetic devices including such SWSs are also disclosed. Exemplary high frequency electromagnetic devices may include a traveling wave tube, a traveling wave tube amplifier, a back wave oscillator, as part of a linear accelerator, a microwave power module, a klystron or a millimeter-wave power module.

8 Claims, 16 Drawing Sheets

METHOD OF MICRO-FABRICATION OF A HELICAL SLOW WAVE STRUCTURE USING PHOTO-RESIST PROCESSES

BACKGROUND OF THE INVENTION

1. Field of the Invention

The present invention relates to micro-fabrication techniques for making electron beam confining structures. In particular, the present invention relates to slow wave structures (SWSs) for microwave amplifiers and oscillators and methods for micro-fabricating such SWSs.

2. State of the Art

A traveling wave tube (TWT) is generally used to provide microwave generation and microwave amplification. A conventional TWT typically includes a slow wave circuit or structure defined by a generally hollow vacuum-tight barrel with optional additional microwave circuitry disposed inside the barrel. An electron source and suitable steering magnets or electric fields are arranged around the slow wave circuit to pass an electron beam through the generally hollow beam tunnel. In a conventional TWT, an electron beam interacts with a propagating electromagnetic wave to amplify the energy of the electromagnetic wave. This interaction may be achieved by propagating the electromagnetic wave through a structure which slows the axial propagation of the electromagnetic wave and brings it into synchronism with the velocity of the electron beam. The kinetic energy in the electron beam is coupled into the electromagnetic wave, thereby amplifying the electromagnetic wave. Such a structure may be referred to as a "slow wave structure". Conventional slow wave structures may take the form of, e.g., a circular, square or hexagonal cross sectioned generally hollow structure surrounding the electron beam.

Various methods for constructing helixes for use in TWTs are known in the art. Common fabrication techniques include winding or machining. For example a thin wire or tape of conductive material may be wound around a mandrel and processed to properly shape the helix to a circular configuration. Drawbacks associated with the winding technique include placing stress on the wire or tape, which may limit stability of the helix under operating conditions. Additionally, when heated during annealing or operation, Wound helixes lack dimensional stability because of, e.g., physical distortion.

Another conventional approach to forming cylindrical helixes suitable for TWTs involves cutting a cylindrical tube into a desired helix pattern using electrical discharge machining. But, such helical structures formed according to this technique tend to be brittle and subject to cracking. Additionally, both conventional winding and machining techniques become impractical when used for high frequency applications because of the need for smaller dimensions associated with higher frequencies.

U.S. Pat. No. 5,112,438 to Bowers discloses a photolithographic method of forming helixes for TWTs. Bowers discloses the use of a mandrel on a lathe as a form for micro-fabricating a SWS. Using conventional planar processing techniques Bowers builds the SWS on the mandrel and then separates the SWS from the mandrel. However, the Bowers approach appears to require sophisticated linear and rotation control during processing.

Yet another prior art approach to forming cylindrical helixes suitable for TWTs is disclosed in U.S. Pat. No. 6,584,675 to Rajan et al. Rajan et al. discloses a method for fabrication of three dimensional TWT circuit elements using laser lithography. According to the method of Rajan et al., a small hollow preform (square or cylindrical tube) is coated with a layer of photoresist material, patterned, stripped and etched and optionally polished. However, Rajan et al. requires an ultraviolet (UV) laser and, like Bowers, a sophisticated linear and rotation controller for processing the preform. Additionally, the method of Rajan et al. requires significant exposure time (1-2 hours) which limits its use for mass production. A similar technique is disclosed in U.S. Patent Application Publication No. U.S. 2003/0151366 to Dayton, Jr. The Dayton, Jr. device also requires expensive laser micromachining for fabrication.

Lithographic techniques are regularly used in the electronics industry to achieve small features required for high frequency electronics. However, these techniques are generally applied to planar wafer substrates or silicon or other semiconductor materials. As such, lithographic techniques have not been readily adapted to produce the types of finely detailed three-dimensional structures called for in TWTs and other high frequency devices designed for high frequency operation.

Thus, there exists a need in the art for new micro-fabrication techniques for SWSs for TWTs and other microwave amplifier and oscillator devices that utilize lithographic techniques for mass production without the drawbacks associated with conventional methods of manufacturing SWSs.

SUMMARY OF THE INVENTION

Methods of micro-fabricating helical, ring bar and tunnel ladder slow wave structures (SWSs) and SWSs formed by such methods are disclosed. Embodiments of high frequency electromagnetic devices including embodiments of SWSs are also disclosed. Additional features and advantages of the invention will be apparent from the detailed description which follows, taken in conjunction with the accompanying drawings, which together illustrate, by way of example, features of embodiments of the present invention.

BRIEF DESCRIPTION OF THE SEVERAL VIEWS OF THE DRAWINGS

The following drawings illustrate exemplary embodiments for carrying out the invention. Like reference numerals refer to like parts in different views or embodiments of the present invention in the drawings and may not be described in detail for all drawing FIGS.

DETAILED DESCRIPTION OF THE INVENTION

The present invention includes helical, ring bar and tunnel ladder embodiments of SWSs and methods of micro-fabricating such SWSs. The embodiments of SWSs disclosed herein each have performance versus cost trade-offs. For example, the tunnel ladder embodiment of the present invention is simpler in construction than the helical and ring bar embodiments. However, the tunnel ladder embodiment tends to have a rather narrow bandwidth (3-5%). The ring bar embodiment has higher power amplification because it has twice the number of rings carrying current and also higher bandwidth (10-20%) relative to the tunnel ladder embodiment. The highest bandwidth performance may be obtained by the helical SWS.

The embodiments of SWSs according to the present invention may not only be used in TWTs, but may also be used in other microwave devices, e.g., back wave oscillators (BWOs), linear accelerators, klystrons, and TWT derivatives, i.e., traveling wave tube amplifiers (TWTAs), microwave power modules (MPMs) and millimeter-wave power modules. Advantages of the disclosed embodiments of SWSs and the methods of micro-fabrication over conventional devices and methods include reduced cost, potential for higher frequency operation, higher level of integration, and simplicity of manufacture. For example, using a micro-fabricated helix or ring-bar as a mask for pattern transfer may reduce costs in mass production of SWSs.

Figure 1:
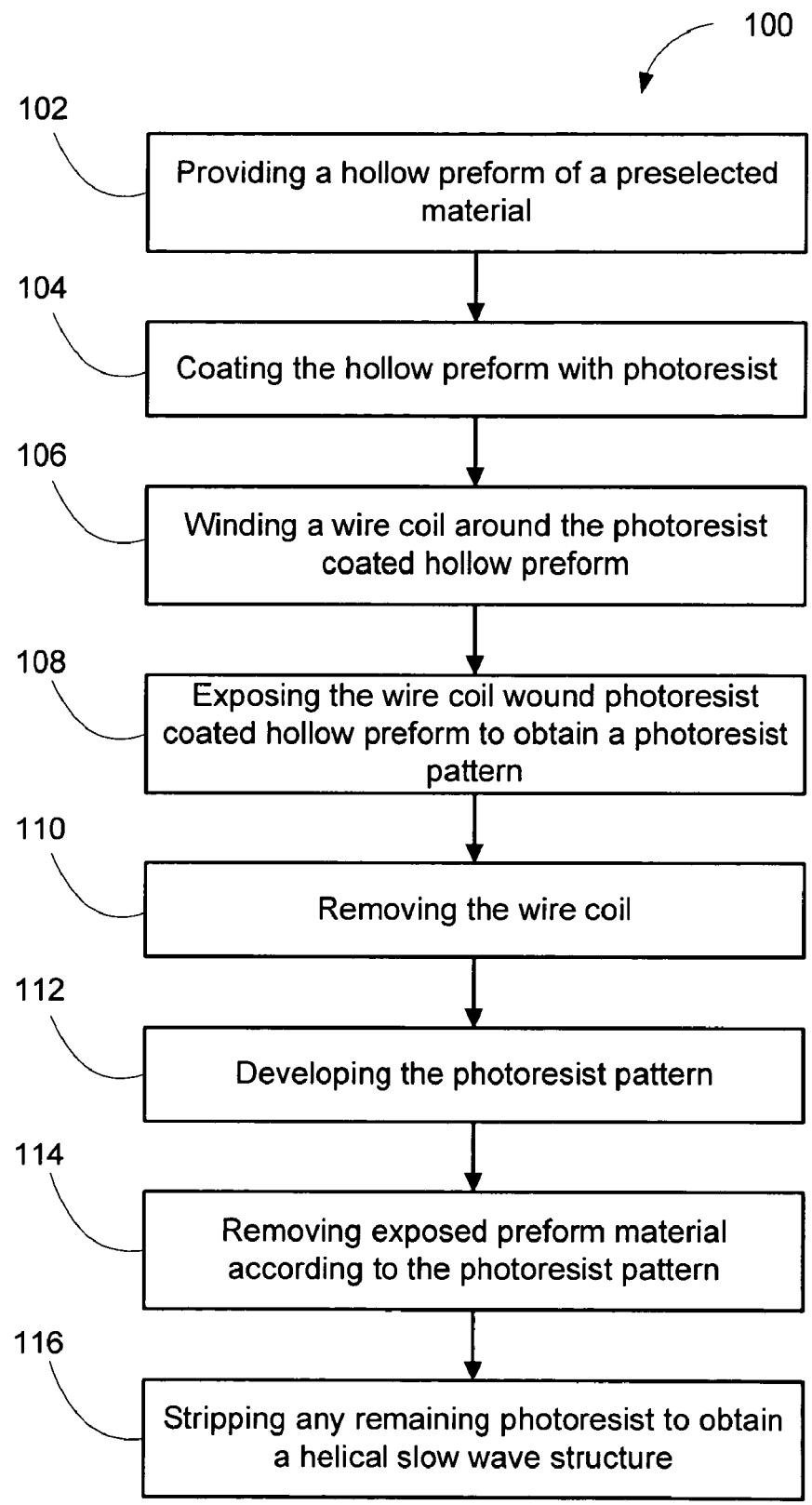
FIG. 1 illustrates a process flow chart of a method of micro-fabricating a helical slow wave structure in accordance with the present invention.

FIG. 1 is a process flow chart of a method 100 of micro-fabricating a helical slow wave structure in accordance with the present invention. Method 100 may include steps of providing a hollow preform of a preselected material 102 and coating the hollow preform with photoresist 104. Method 100 may further include steps of winding a wire coil around the photoresist coated hollow preform 106 and exposing the wire coil wound photoresist coated hollow preform to obtain a photoresist pattern 108. The wire used to form the coil may have any suitable cross-section, for example and not by way of limitation, flat, round, rectangular, square or oval. Method 100 may further include steps of removing the wire coil 110 and developing the photoresist pattern 112. Method 100 may further include steps of removing exposed preform material according to the photoresist pattern 114 and stripping any remaining photoresist to obtain a helical slow wave structure 116. Method 100 may further include polishing and electroplating (not shown in FIG. 1).

Figure 2:
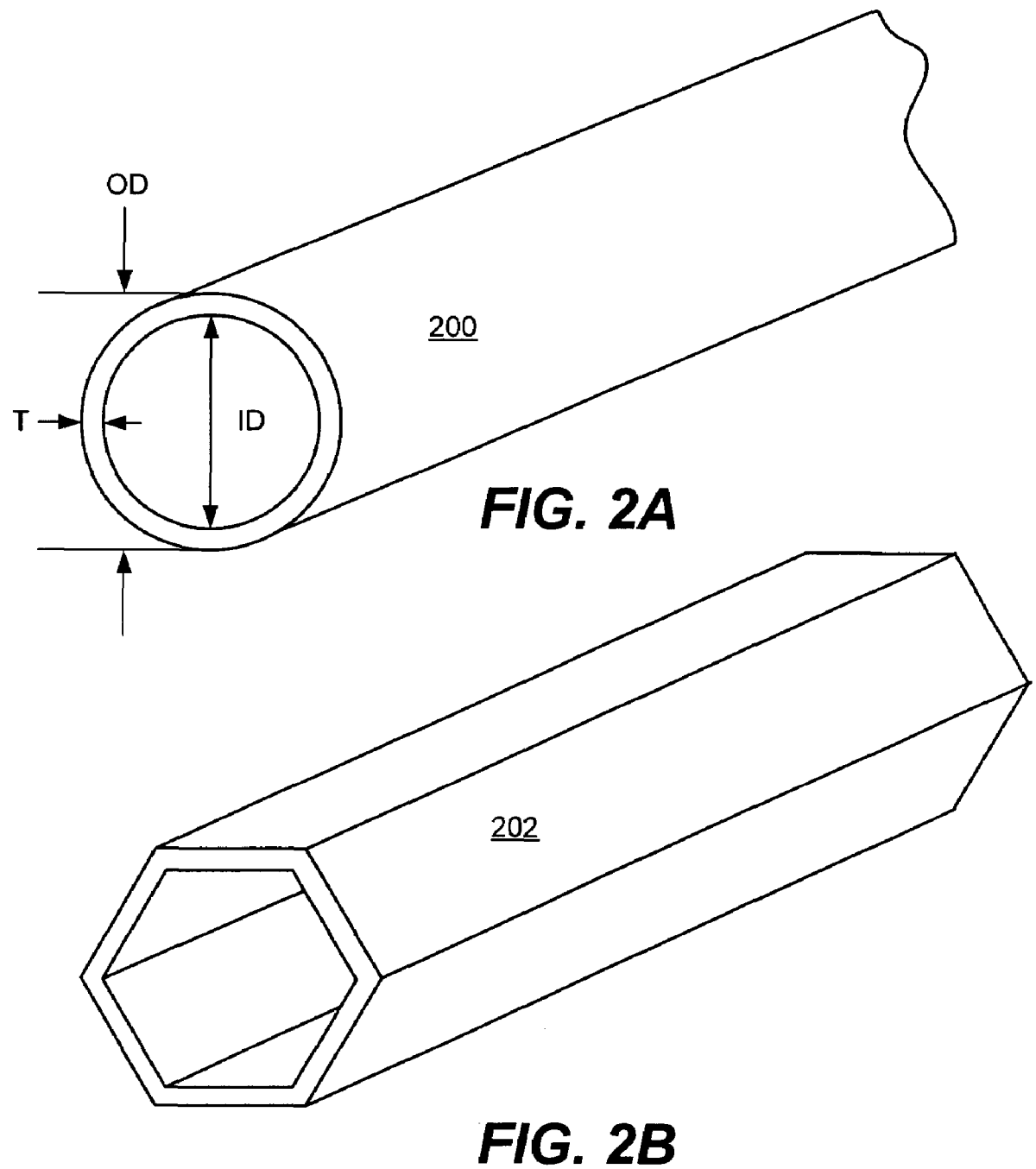
FIGS. 2A and 2B illustrate embodiments of circular and hexagonal cross-section preforms, respectively, according to the present invention.

An embodiment of a hollow preform according to the present invention may be of any shape depending on the desired final shape of the slow wave structure. Referring to FIG. 2A, an embodiment of a preform may be formed of a cylindrical hollow tube 200 having preselected wall thickness (T), inner diameter (ID) and outer diameter (OD). While a circular cross-section is presently preferred, other cross-sections, e.g., square, pentagonal, hexagonal, heptagonal, octagonal and other higher order polygonal cross-sections are also suitable embodiments of the SWSs of the present invention. The hollow preform may be formed of a preselected material comprising, for example and not by way of limitation, copper, molybdenum, tungsten and alloys containing these metals, according to embodiments of the present invention. A presently preferred embodiment of a hollow preform is comprised of molybdenum.

The circular cross-section of the preform shown in FIG. 2A will generally yield higher bandwidth performance relative to the polygonal cross-section SWS embodiments. The wall thickness (T) of the cylindrical preform may be any suitable dimension. FIG. 2B illustrates a hexagonal cross-sectioned preform tube 202 according to another embodiment of a preform in accordance with the present invention. A feature of the hexagonal preform 202 is flat facets for the attachment of flat dielectric supports (blocks typically) to the helical circuit. The preforms disclosed herein may be formed by drawing, extrusion, electro-forming and other suitable processes known to one of skill in the art. The external dimension (OD in FIG. 8, below) may be precision ground to a selected tolerance. Likewise, the inner diameter (ID in FIG. 8, below) may also be electrical discharge machined to any required tolerance. Furthermore, the polishing and electroplating at the end of the method 100 of micro-fabricating may be used to correct the dimensions to meet any tolerance required.

Figure 3:
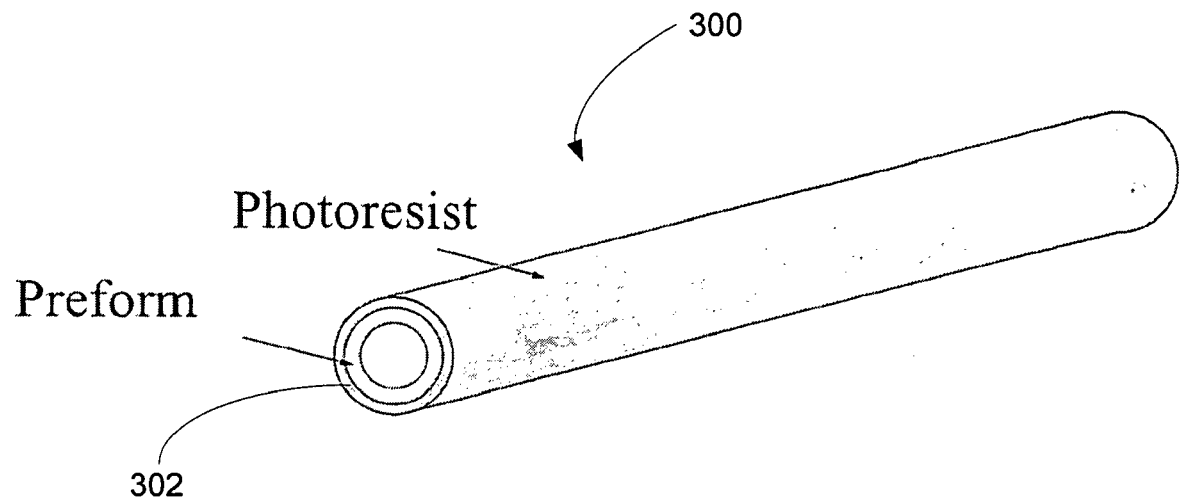
FIG. 3 illustrates an embodiment of a cylindrical preform treated with a layer of photoresist in accordance with the method embodiment of the present invention.

FIG. 3 illustrates an embodiment of a cylindrical preform 300 treated with a layer of photoresist 302 in accordance with method 100. The photoresist 302 may be either positive or negative photoresist as necessary for forming a helix pattern according to alternative embodiments of the present invention. Both the inside and the outside of the preform are coated with a layer of photoresist. It is important that the inside of the hollow preform be coated with photoresist to protect it from further processing steps until the photoresist is removed. The inside layer of photoresist 302 is not shown in FIG. 3 for clarity. Application of the photoresist 302 may be accomplished using electrophoretic coating, spraying, dip coating, or types of spin coating as is known in the art. It has been found that the electrophoretic photoresist application has yielded the best results among many different coating techniques and is, thus, a presently preferred photoresist application method. The selection of a particular photoresist material often may depend on the etching chemistry and the etching tool to be used in conjunction with the photoresist. Desirable characteristics of a suitable photoresist in accordance with the present invention include chemical inertness and mechanical strength and sufficient resolution. Suitable photoresists may be an ultraviolet (UV) developable photoresist such as those manufactured by Shipley Company of Marlborough, Mass. Shipley's Eagle ED2100, negative photoresist having a thickness typically in a range of 0.5 mil to 1.0 mil is a suitable photoresist according to an embodiment of the present invention. Further details on the electrophoretic photoresist coating process may be found in a process handbook of photoresist available from Shipley.

Figure 4:
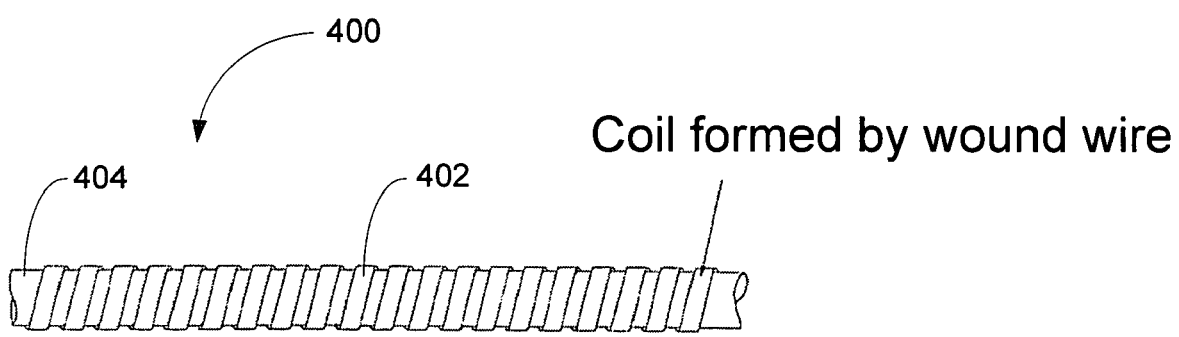
FIG. 4 illustrates a photoresist coated preform having a helical circuit wound by flat wire according to the present invention.

FIG. 4 illustrates a photoresist coated preform 400 having a helical circuit 402 wound by wire. The wire may be a flat wire or any other shaped wire suitable for the intended use, application and need. For example, as noted above, the wire used to form the coil may have any suitable cross-section, for example and not by way of limitation, flat, round, rectangular, square or oval. A coil winding machine may be used to wind the flat wire. The coil winding machine is capable of controlling the pitch to within a few micrometers. The flat wire or other shaped wire may be secured by taping or spot welding on the preform 404. The flat wire serves as masking material in pattern transferring. As the coil wound preform will be subjected to UV exposure and needs to be rotated during the exposure, it is presently preferred that flat wire be used including straight or flat side walls that is thin in thickness. The pitch of the coil as it is wound may also be varied according to other embodiments of the present invention. Tapering of the pitch of the coil may be performed at any point during the coil processing including near and/or at either or both ends of the helix. Exemplary flat wire thicknesses may be in the range of 1.0 to 2.0 mils. However, other wire dimension embodiments (smaller and larger) may be utilized consistent with the principles of the present invention. Exemplary materials for the flat wire are copper, aluminum, stainless steel, and any other suitable wire materials. A satisfactory coil winding of a preform about 6" in length may be obtained in approximately 10 minutes according to method 100. This winding 106 process may be carried out in environments having conventional industrial lights. However, preferred environment includes light filters for conventional industrial lighting that filters out the UV light of the light bulbs.

Figure 5:
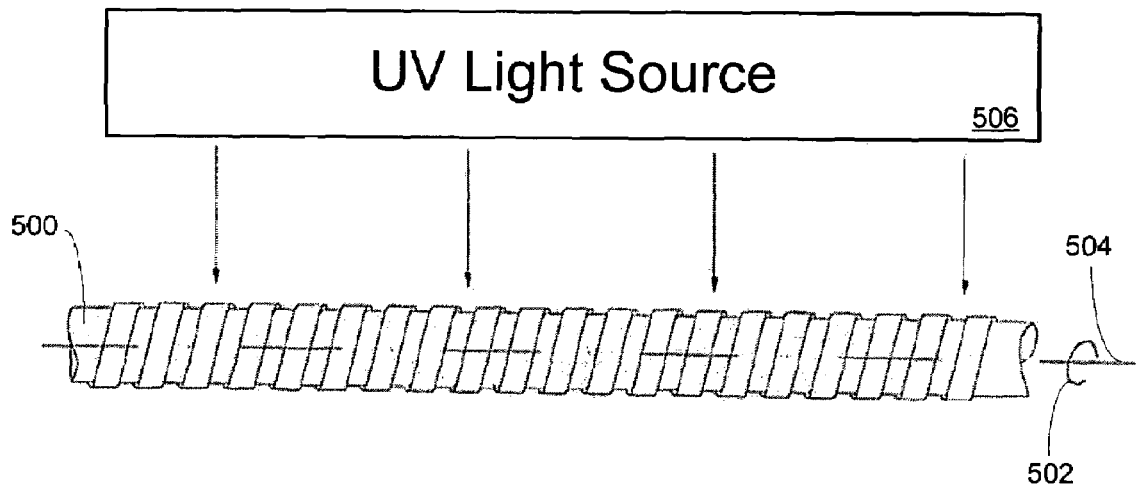
FIG. 5 illustrates optical exposure of the photoresist achieved under a conventional UV light source according to the present invention.

As illustrated in FIG. 5, the optical exposure of the photoresist may be achieved under a conventional UV light source commonly used in semiconductor processing. Rotating 502 the preform 500 along its axis 504 enables the UV light source 506 to expose the entire surface of the preform 500. Thus, a complete helical pattern can be well defined by the flat wire. A satisfactory helical pattern may be obtained in 30 seconds of UV light exposure according to method 100.

Figure 6:
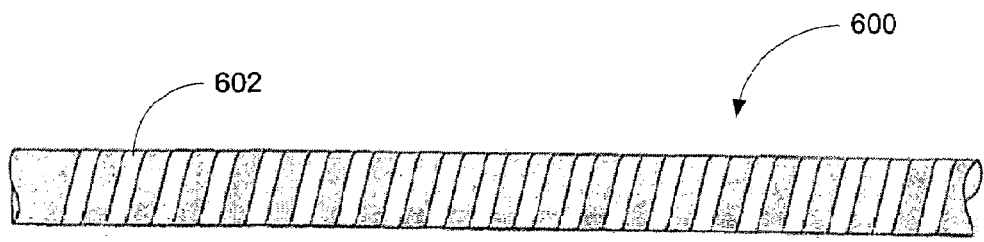
FIG. 6 illustrates a desired helical pattern on the preform according to an embodiment of the present invention.

The flat wire may be removed from the preform and then developed. In a negative photoresist, the light makes the exposed photoresist insoluble allowing the unexposed photoresist to be removed. FIG. 6 illustrates a desired helical pattern 602 on the preform 600 according to an embodiment of the present invention. The helical pattern 602 is a replica of helical circuit 402 formed by the flat wire. Since light is blocked by flat wire, the unexposed photoresist is removed leaving an open area for the etching chemical to access the preform. Development of such photoresist is known to those having ordinary skill in the art. Development times for photoresist are also known to those having ordinary skill in the art. Typical photoresist development times are on the order of 1 to 2 minutes.

Figure 7:
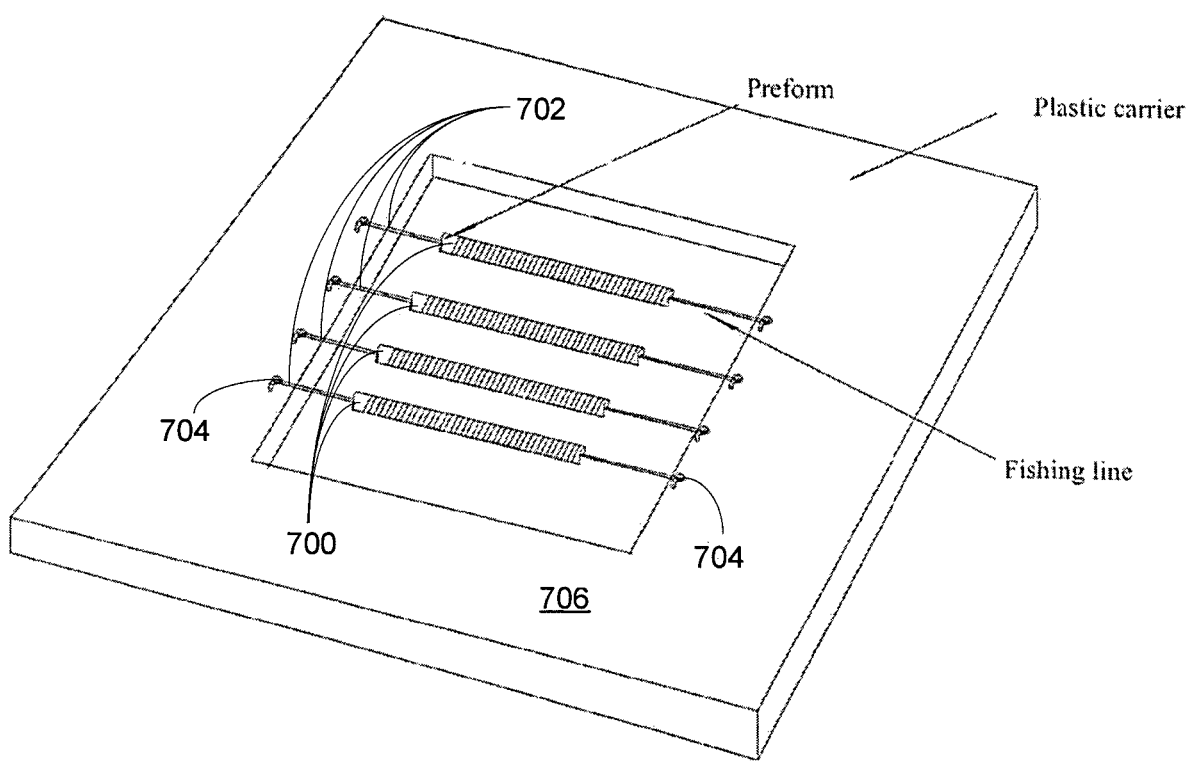
FIG. 7 illustrates a perspective view of an apparatus for removing preform material from a SWS according to an embodiment of the present invention.

Once the preform is developed, removal of preform material from areas of the preform not covered by photoresist can be performed by chemical etching. One presently preferred method of removing exposed preform material 114 is known as "wet" etching. Wet etching uses a chemical etchant optimized to remove the preform material and also having good etch selectivity with respect to the photoresist. An embodiment of wet etching according to the present invention may be accomplished by threading a fishing line 702 through a hollow preform 700 (4 shown in FIG. 7) and tying both ends onto plastic screws 704 on a plastic carrier 706 as illustrated in FIG. 7. Of course the use of a plastic carrier and/or plastic screws is intended for illustrative purposes and it is understood that this is not limiting and that many such carriers may be made out of many different materials and structures and designs. The hollow preform is also presented here for exemplary illustrative purposes only and any shaped structure that performed the function in a similar manner would be suitable and is considered to be within the scope of the present invention.

Several preforms may be placed on the same carrier for the batch processing. Each preform is hung over a center opening on the carrier and is free to rotate once the etchant stream reaches the preform surface. The carrier is then placed on a conveyer and fed through a main chamber where the etchant is mechanically pumped and sprayed through nozzles specially designed for optimum uniformity according to embodiments of the present invention. The etchant may be fed to the top and the bottom sides of the carrier having adjustable pressure on each etchant stream according to embodiments of the present invention. A satisfactory etching for preforms having 8 mils in thickness can often be adjusted depending on the process conditions and constraints and may take from around a minute or so to 60 to 90 minutes using potassium ferric-hexacynide on molybdenum preforms. In addition to etchant pressure control, the best etching results may be achieved by adjusting the conveyer speed and changing the feeding angles of the carrier between runs. The potassium ferric-hexacynide etchant disclosed in this embodiment is not intended to limit the use of other etchants, especially, with respect to alternative preform materials. Other etchants may be used. Additionally, it should be noted that other etching techniques such as plasma etching, ion beam etching, and reactive ion etching may be used without limitation.

After the preform has been etched into desired shape, the preform may be removed from the etchant and rinsed in water and blown dry by nitrogen. The photoresist is then stripped using process chemicals known to those having ordinary skill in the art, followed by rinsing in water and blow drying by nitrogen.

Final polishing may be carried out in a sulfuric acid solution which is then neutralized with an ammonium hydroxide solution to produce a somewhat more polished appearance. A layer of pure copper or gold having a thickness of 3 to 5 times of the skin depth at an operation frequency may then be electrolytically deposited onto the polished preform.

Figure 8:
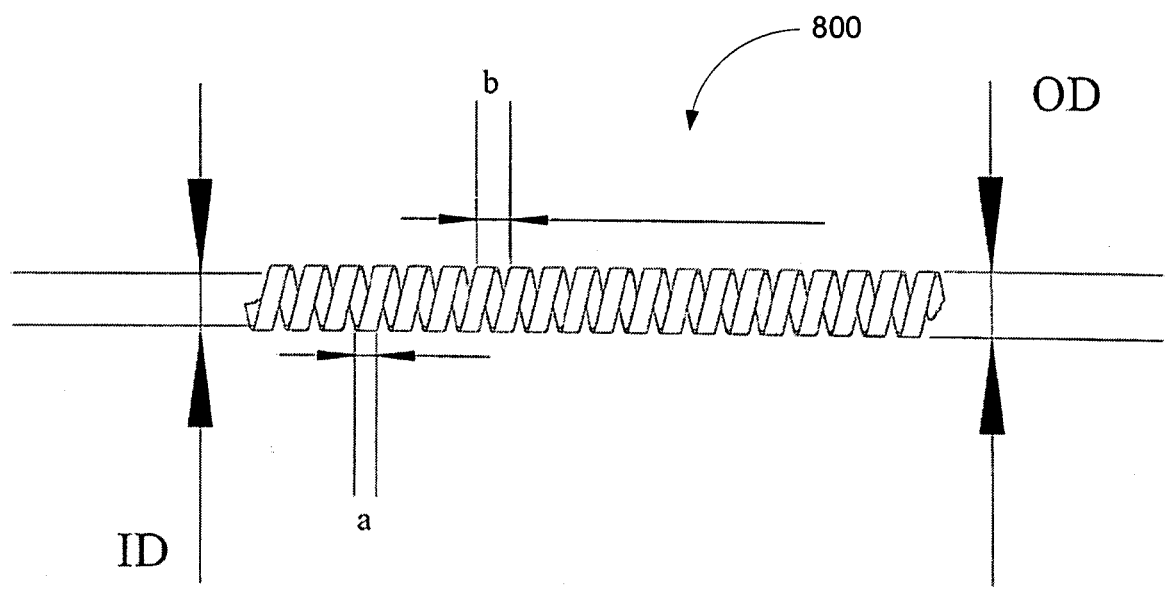
FIG. 8 illustrates a side view of an embodiment of a helical SWS formed according to an embodiment of a method of manufacturing in accordance with the present invention.

FIG. 8 illustrates a side view of a helical SWS 800 having an outside diameter, OD, inside diameter, ID and a plurality of windings each having a width "a" and a distance "b" between the windings.

Figure 9:
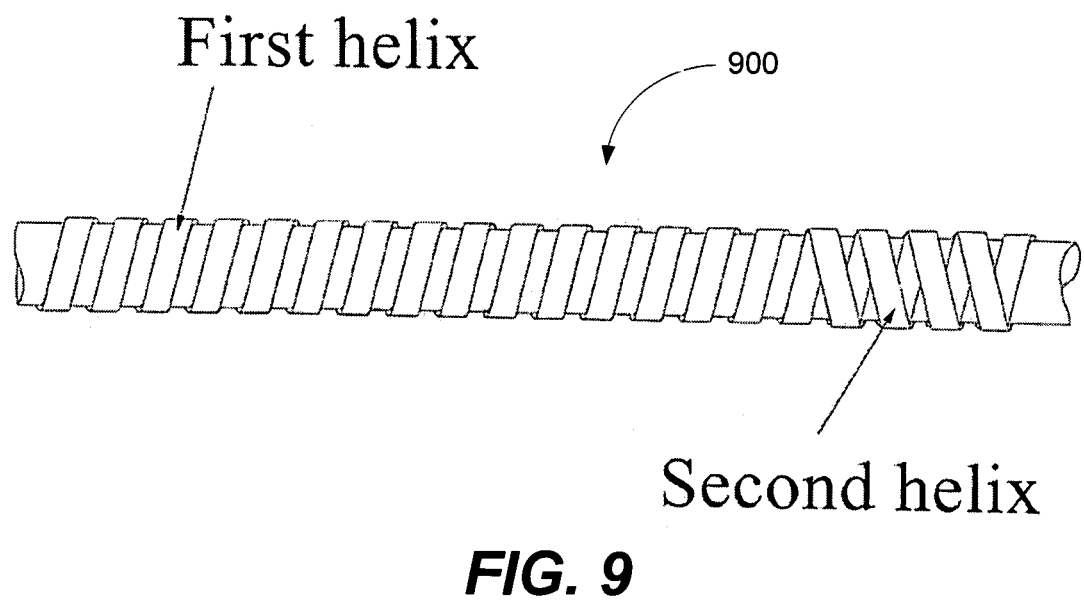
FIG. 9 illustrates an embodiment of a view of a double helix SWS according to the present invention.

FIG. 9 illustrates an embodiment of a double helix SWS 900 in accordance with the present invention. A double helix SWS 900 includes a first helix wound by flat wire and a second helix wound by flat wire at a plurality of turns opposite to the first helix so as to coaxially surround and superpose on the first helix, as illustrated in FIG. 9. The double helix SWS may be constructed in accordance with embodiments of method 100 and the principles of the present invention.

According to another embodiment of the present invention a method of micro-fabricating a ring bar SWS is disclosed. By transferring individual patterns on a photoresist coated preform using a miniature fixture and three masks, a ring bar SWS may be micro-fabricated using a conventional UV light source and photoetching.

Figure 10:
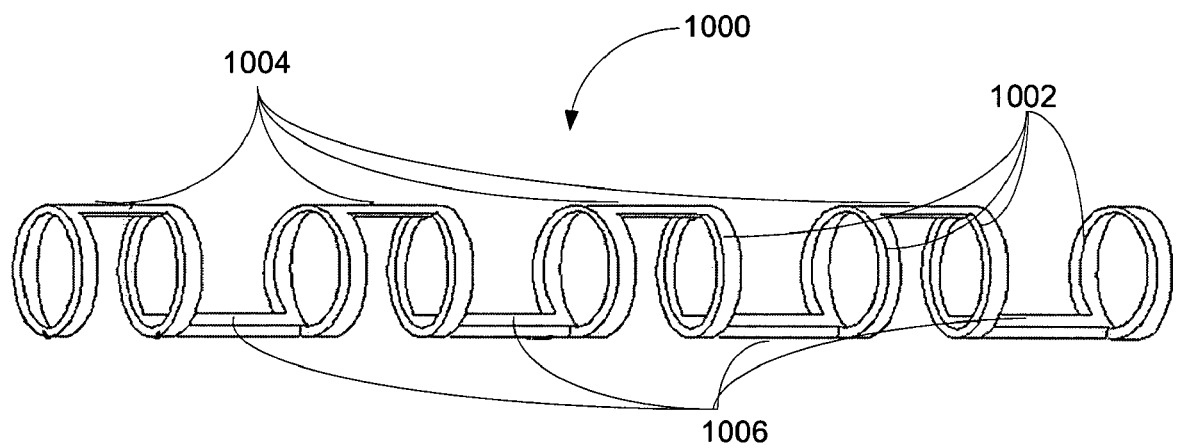
FIG. 10 illustrates a perspective view of a ring bar SWS according to an embodiment of the present invention.

FIG. 10 is a perspective view of a ring bar SWS 1000 according to an embodiment of the present invention. A ring bar SWS 1000 is a transformed double-helix structure having rings 1002, top bars 1004 and bottom bars 1006. The ring bar SWS 1000 is capable of handling high power and is not prone to having oscillation during operation, as compared with its counterpart—the single helix. The structure of a ring bar SWS 1000 is repeated such that adjacent rings are connected by bars (top bars 1004 and bottom bars 1006) that are separated by 180 degrees. Accordingly, a ring bar SWS 1000 is a three-dimensional structure formed of three components rings 1002, top bars 1004 and bottom bars 1006.

Figure 11:
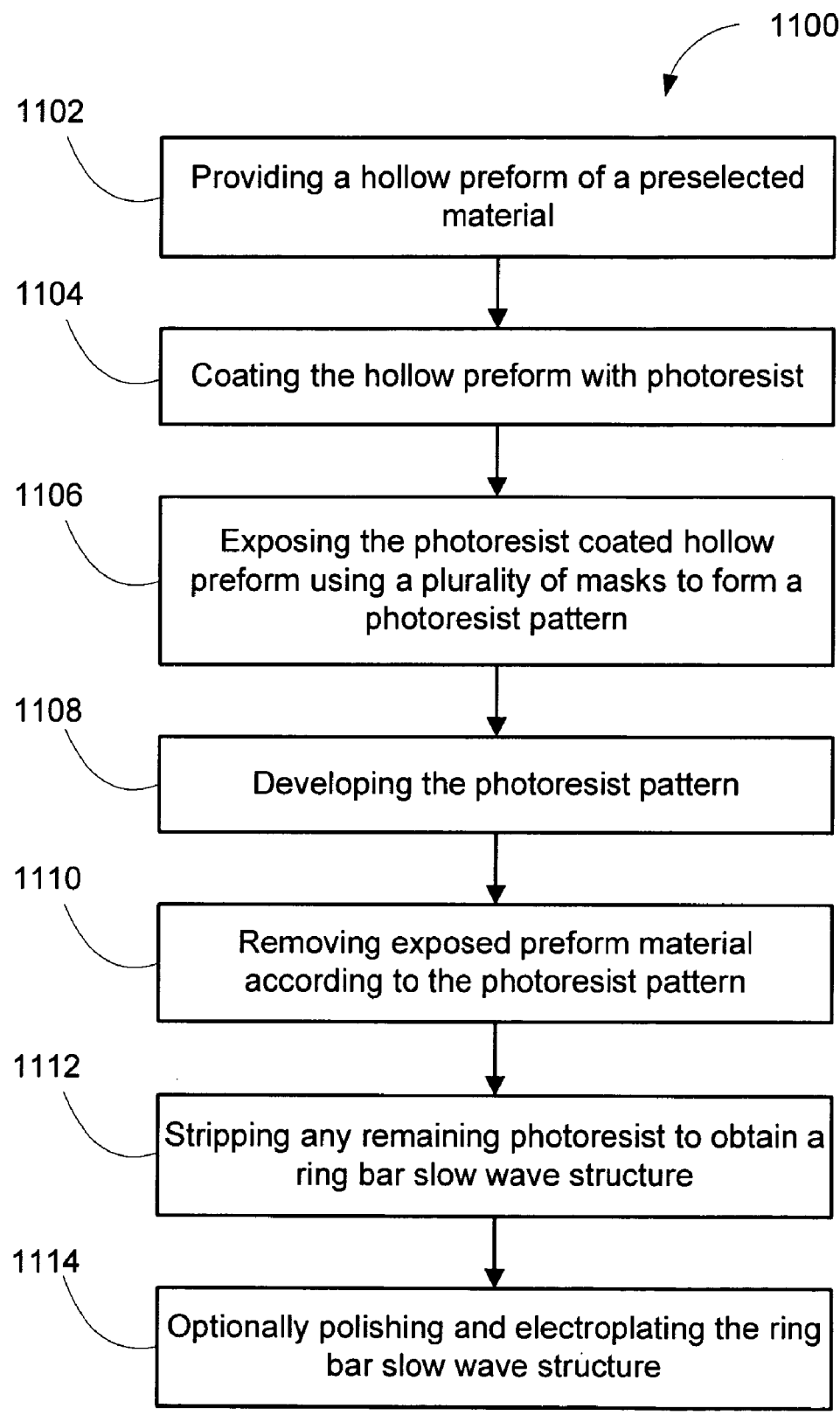
FIG. 11 illustrates a process flow chart of an embodiment of a method of forming a ring bar SWS in accordance with the present invention.

FIG. 11 is a process flow chart of an embodiment of a method 1100 of forming a ring bar SWS in accordance with the present invention. Method 1100 may include steps of providing a hollow preform of a preselected material 1102 and coatingt he hollow preform with photoresist 1104. Method 1100 may further include steps of exposing the photoresist coated hollow preform using a plurality of masks to form a photoresist pattern 1106 and developing the photoresist pattern 1108. Method 1100 may further include steps of removing exposed preform material according to the photoresist pattern 1110 and stripping any remaining photoresist to obtain a ring bar slow wave structure 1112. Method 1100 may optionally include polishing and electroplating the ring bar slow wave structure 1114.

The preform may be of any shape depending on the desired final shape of the ring bar SWS. For example and not by way of limitation the preform may be a cylindrical hollow tube having a circular cross-section and a preselected inner diameter (ID) and outer diameter (OD). However, preforms of polygonal cross-section are suitable alternative embodiments according to other aspects of the present invention.

Figure 12:
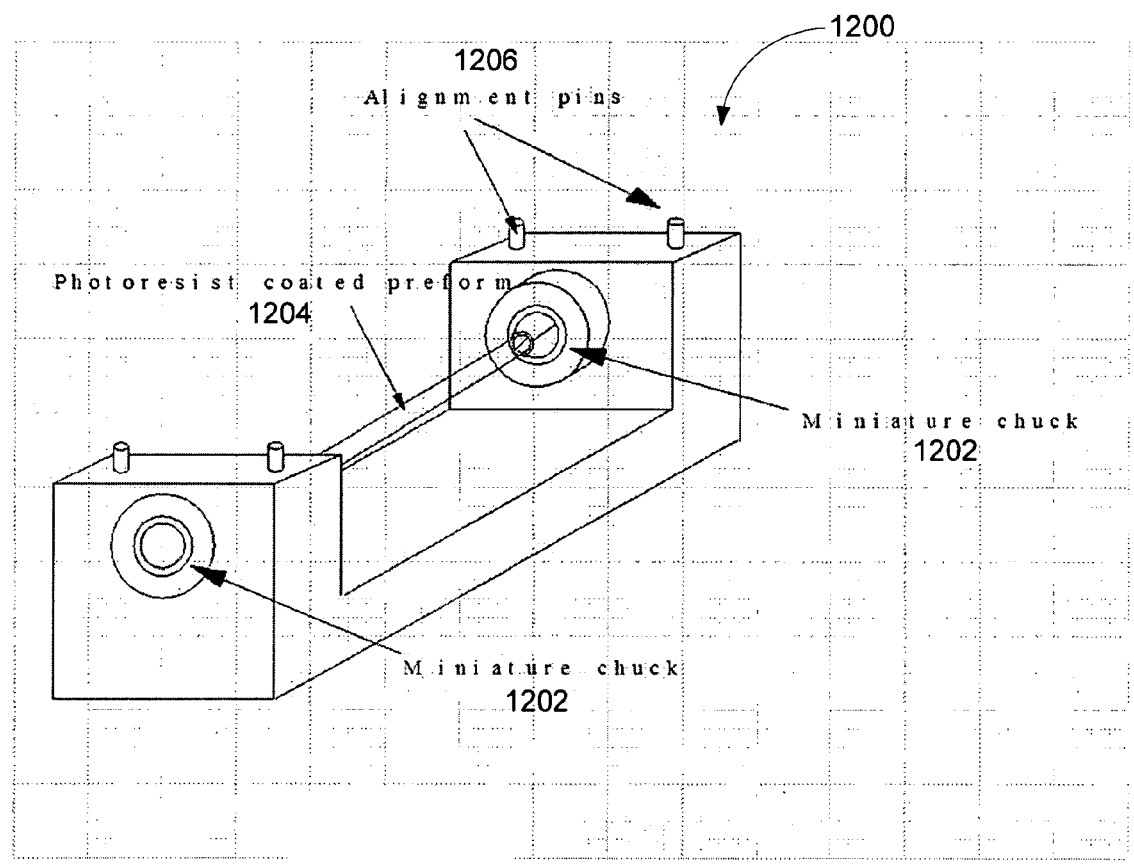
FIG. 12 illustrates a perspective view of an embodiment of a fixture for exposing a photoresist coated preform according to the present invention.

FIG. 12 is a perspective view of an embodiment of a fixture 1200 for exposing a photoresist coated preform 1204 according to the present invention. The position of the preform 1204 can be read from the marking outside the chuck 1202. The alignment pins 1206 provide accurate position registration of each component on different masks. Of course, other similar functional embodiments are also included and anticipated in the present invention.

Figure 13:
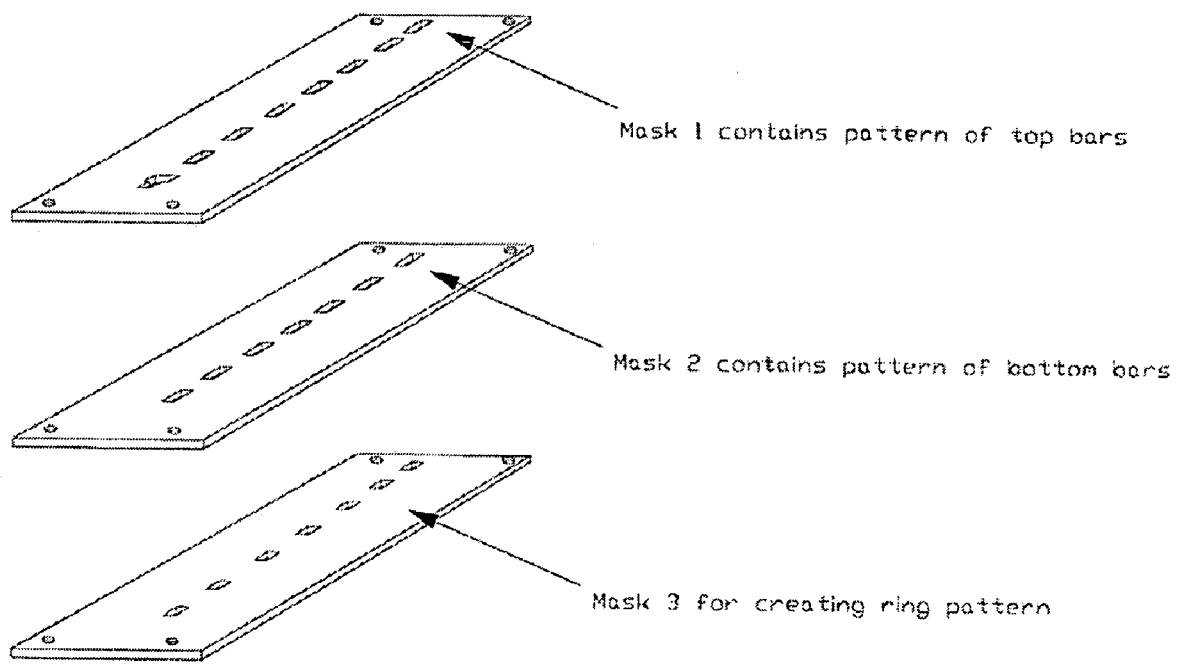
FIG. 13 illustrates a perspective view of three exemplary masks that may be used during the exposing process according to an embodiment of a method of the present invention using the fixture of FIG. 12.

FIG. 13 is a perspective view of three exemplary masks that may be used with or without fixture 1200 during the exposing step 1106 according to method 1100 of the present invention in the formation of a ring bar SWS 1000. Mask 1 may include patterning for the top bars 1004 of a ring bar SWS 1000. Mask 2 may include patterning for bottom bars 1006 of a ring bar SWS 1000. Mask 3 may include patterning for rings 1002 of a ring bar SWS 1000. Of course, this is just one exemplary method of producing such a structure. It is evident that there are many variants of the exemplary method presented here and all such variants of the exemplary method presented here are considered within the scope of the present invention.

An exemplary embodiment of a micro-fabrication process for a ring bar SWS according to the present invention using the fixture 1200 shown in FIG. 12 will now be described. A small hollow preform constructed of a selected material is coated with a layer of photoresist material, followed by a softbake at 120° C. for 40 minutes in a convection oven and then installed onto a fixture 1200 with two chucks 1202 which secures the preform position during processing. The first mask which contains only the pattern of top bars is installed by aligning registration holes with pins on the fixture, followed by an exposure under UV for 20 seconds. The first mask is removed from the fixture after exposure. The preform is then rotated 180 degrees from the starting position for the bottom bars patterning. The second mask which contains only the pattern of bottom bars is installed by aligning registration holes with pins on the fixture, followed by exposure under UV for 20 seconds. The second mask is removed from the fixture after exposure. The third mask which contains only square apertures is installed onto the fixture and exposed under a UV light source. During exposure, the preform is rotating to complete the ring pattern. The pattern masked preform is then etched to create a preform having the desired shape. After resist stripping, the shaped preform is etched and electroplated with copper, for example, for better conductivity and, therefore, lower loss. It should be noted that materials other than copper, such as, for example, nickel, platinum or gold, may be used consistent with other embodiments of the present invention. Similarly, other material deposition techniques such as CVD, PVD, sputtering, e-beam evaporation and the like may also be used consistent with embodiments of the present invention.

Embodiments of method 1100 according to the present invention may be used to construct ring bar circuit structures for use in TWT's and other microwave devices utilizing SWSs, wherein the SWSs have an inside diameter in the range of, for example and not by way of limitation, about 0.018 inches to about 0.125 inches with wall thickness being in the range of 4-10 mils. Of course, other suitable SWS dimensions may be formed according to other embodiments of the present invention. The principles of the present invention have particular usefulness when applied to electrically conductive and etchable materials including without limitation, molybdenum, copper, tungsten, and alloys containing these materials. The principles of the present invention may also be applied to non-conductive materials or semiconductors.

Yet another embodiment of an SWS according to the present invention is the tunnel ladder SWS. The tunnel ladder SWS has minute dimensions with selectively spaced rungs and parallel, elongated side rails supporting opposed ends of each rung. A silicon wafer is masked and anisotropically etched to produce parallel troughs with sloped walls. SU-8 photoresist is exposed through a second mask and the unexposed areas etched away. Copper is electroplated up from the silicon surface. The SU-8 and silicon are removed. Diamond blocks are bonded to ladder rungs and the ladder assembly is diffusion bonded, brazed or otherwise assembled into a double ridge waveguide. Thermoacoustic bonding and electrical discharge machining (EDM) may be used in embodiments of the present invention.

An embodiment of an electron beam confining structure composed of a pair of opposed electroconductive ladders having precise dimensions and forming an enclosed, elongated cavity (tunnel) is disclosed. Another embodiment of an electron beam confining structure may be formed of a pair of ladders integrally connected about an integral elongated hinge joint parallel to each pair of siderails of each ladder structure.

Formation of a pair of integrally connected ladders is especially advantageous since each ladder can be made identical to the other structurally and with the same electrical properties and, by employing a hinge joint parallel and equidistant to the closest side rail of each ladder, the pair of ladders may be folded about the hinge-joint to form a tunnel with precisely aligned ladders and the desired axial symmetry for an electron beam confining cavity.

Simultaneous formation of a pair of identical ladders by photolithography means on a substrate having a pair of identical, parallel troughs results in an integral structure composed of two parallel, identical ladders having concave rungs and an elongated hinge joint. Thus, each operation performed in the photolithography procedure and in the formation of the parallel troughs is exactly the same for each ladder unit of the dual ladder structure.

An exemplary embodiment of a substrate may be formed of silicon or similar material having a crystal structure such that etching creates an elongated trough when viewed in cross-section. A continuous copper deposition is formed by electroplating over a mask formed on the silicon substrate by photolithography techniques. Removal of the substrate produces a single structure having a pair of identical symmetrical parallel ladders.

Figure 14:
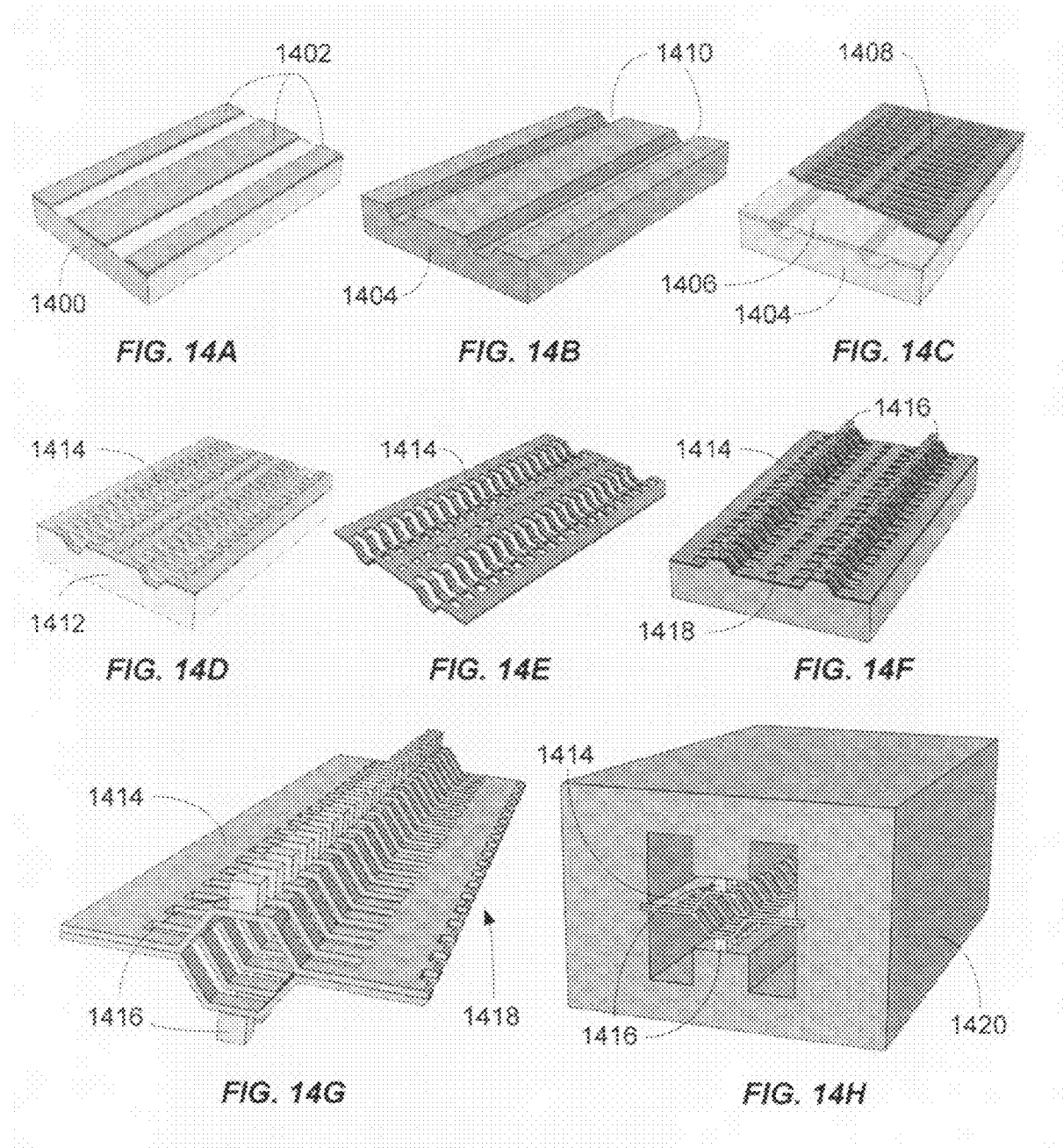
FIGS. 14A-14H are graphical illustrations of a micro-fabrication process sequence for manufacturing a tunnel ladder SWS according to an embodiment of the present invention.

FIGS. 14A-14H are graphical illustrations of a micro-fabrication process sequence for manufacturing a tunnel ladder SWS according to an embodiment of the present invention. The micro-fabrication process shown in FIGS. 14(a)-14(h) may be used in the construction of helix, ring-bar and folded tunnel ladder SWSs, consistent with embodiments of the present invention. More particularly, FIG. 14A graphically illustrates masking 1402 of a silicon substrate 1400. FIG. 14B graphically illustrates an etched silicon substrate 1404 with trenches 1410 obtained after etching the masked silicon substrate 1400 shown in FIG. 14A. FIG. 14C graphically illustrates depositing photoresist 1406 on the etched substrate 1404 followed by placement of a mask 1408 over the photoresist 1406. FIG. 14D graphically illustrates the developed substrate 1412 after electrodeposition of a copper tunnel ladder SWS 1414, thereon. FIG. 14E graphically illustrates the copper tunnel ladder SWS 1414 once removed from the photoresist 1406 and substrate 1412 layers. FIG. 14F graphically illustrates an embodiment of a pick and place process step, whereby support blocks 1416 are placed evenly along peaks of the copper tunnel ladder SWS 1414 prior to folding at a center hinge 1418. FIG. 14G graphically illustrates the copper tunnel ladder SWS 1414 after folding at the center hinge 1418. FIG. 14H graphically illustrates the copper tunnel ladder SWS 1414 after placement within and diffusion bonding to a double ridge wave guide 1420. FIG. 14H shows the basic geometry of the tunnel ladder SWS 1414, according to the present invention. The ladder fabrication begins with the anisotropic etching of a silicon wafer 1400, see FIG. 14B. This is a standard micro-electrical-mechanical systems (MEMS) process. An SiO$_2$ mask 1402 defines two trenches 1410, see FIG. 14A. Anisotropic etching with KOH produces the slope-walled trenches 1410 that will define three sides of the hexagonal beam tunnel, see FIG. 14B. After etching, SU-8 photoresist 1406 is poured onto the etched silicon substrate 1404, covering the entire silicon surface, see FIG. 14C. A mask 1408 is aligned over the trenches 1410, see FIG. 14C. The mask 1408 defines the rungs in the ladder circuit—and a series of axially aligned perforations 1418, which will become a folding line (hinge joint) for the ladder circuit, see FIG. 14F. Ultraviolet light is used to harden the exposed areas of the SU-8 photoresist 1406. The unexposed areas of the photoresist 1406 are etched away leaving two sets of SU-8 photoresist features that will become FIGS. 14A-14H are graphical illustrations of a micro-fabrication process sequence for manufacturing a tunnel ladder SWS according to an embodiment of the present invention. The micro-fabrication process shown in FIGS. 14(a)-14(h) may be used in the construction of helix, ring-bar and folded tunnel ladder SWSs, consistent with embodiments of the present invention. More particularly, FIG. 14A graphically illustrates masking 1402 of a silicon substrate 1400. FIG. 14B graphically illustrates an etched silicon substrate 1404 with trenches 1410 obtained after etching the masked silicon substrate 1400 shown in FIG. 14A. FIG. 14C graphically illustrates depositing photoresist 1406 on the etched substrate 1404 followed by placement of a mask 1408 over the photoresist 1406. FIG. 14D graphically illustrates the developed substrate 1412 after electrodeposition of a copper tunnel ladder SWS 1414, thereon. FIG. 14E graphically illustrates the copper tunnel ladder SWS 1414 once removed from the photoresist 1406 and substrate 1412 layers. FIG. 14F graphically illustrates an embodiment of a pick and place process step, whereby support blocks 1416 are placed evenly along peaks of the copper tunnel ladder SWS 1414 prior to folding at a center hinge 1418. FIG. 14G graphically illustrates the copper tunnel ladder SWS 1414 after folding at the center hinge 1418. FIG. 14H graphically illustrates the copper tunnel ladder SWS 1414 after placement within and diffusion bonding to a double ridge wave guide 1420. FIG. 14H shows the basic geometry of the tunnel ladder SWS 1414, according to the present invention. The ladder fabrication begins with the anisotropic etching of a silicon wafer 1400, see FIG. 14B. This is a standard micro-electrical-mechanical systems (MEMS) process. An SiO$_2$ mask 1402 defines two trenches 1410, see FIG. 14A. Anisotropic etching with KOH produces the slope-walled trenches 1410 that will define three sides of the hexagonal beam tunnel, see FIG. 14B. After etching, SU-8 photoresist 1406 is poured onto the etched silicon substrate 1404, covering the entire silicon surface, see FIG. 14C. A mask 1408 is aligned over the trenches 1410, see FIG. 14C. The mask 1408 defines the rungs in the ladder circuit—and a series of axially aligned perforations 1418, which will become a folding line (hinge joint) for the ladder circuit, see FIG. 14F. Ultraviolet light is used to harden the exposed areas of the SU-8 photoresist 1406. The unexposed areas of the photoresist 1406 are etched away leaving two sets of SU-8 photoresist features that will become the slots in the ladder structure. At this point copper is electroplated onto the developed silicon substrate 1412 to a uniform thickness of 60 μm in one example, see FIG. 14D. Of course much thicker or thinner plated layers may also be used consistent with additional embodiments of the present invention. The copper tunnel ladder SWS circuit 1414 may be obtained by etching away the SU-8 photoresist 1406 and either a sacrificial layer (not shown) and/or the silicon substrate 1412 according to embodiments of the present invention, see FIG. 14E.

In order to cool the circuit and provide structural rigidity, metalized or non-metalized dielectric forms or heat-transfer spacers 1416 including, but not limited to, cubes, wedges, bars, slides, for example, diamond cubes are individually bonded to the backside of the copper ladder 1414, see FIG. 14F. For example, prior to dicing into cubes, the metalized diamond substrate may, for example, be sputtered with gold and/or other materials to provide the interface material for bonding. In the past, the diamond cubes were positioned by fabrication of intricate fixtures that were then populated with diamond blocks by hand. Heat-transfer spacers 1416 according to embodiments of the present invention may be formed of any suitable insulating material including oxides and nitrides in general. More specifically, heat-transfer spacers 1416 may be formed of diamond, boron nitride, aluminum nitride, beryllium oxide, silicon carbide and aluminum oxide and related and similar compounds thereof.

Taking advantage of existing semiconductor manufacturing "pick and place" and wire bonding equipment, the heat-transfer spacers comprise individual metalized diamond blocks which are thermoacoustically bonded to each ladder rung, see FIG. 14F. A combination of preheat temperature, pressure, and friction heating from acoustic motion may be used to adhere the diamond blocks 1416 to the circuit rungs before diffusion bonding. Modified wirebonding equipment can be used to achieve positioning accuracy of a few μm. Once the diamond blocks 1416 are bonded to the ladder circuit 1414, the copper sheet is folded in half at the perforations 1418, see FIG. 14G. providing excellent alignment between the two ladder structures. The ridged waveguide vacuum envelope 1420 may be made by wire-EDM or a number of other techniques including, where appropriate, conventional machining, see FIG. 14H. According to one embodiment, diffusion bonding may be used to attach the ladder 1414 and diamond blocks 1416 to the vacuum envelope 1420. A stainless steel mandrel (not shown) may be inserted in the beam tunnel during the diffusion bond step to prevent the deformation of the copper ladder circuit 1414.

This exemplary combination of anisotropic MEMS, SU-8 LIGA-like, and wire EDM fabrication processes as disclosed in the method embodiments herein may be used to produce an extremely accurate and repeatable slow wave circuit. LIGA is a German acronym for X-ray lithography, electrodeposition and molding. Other processing embodiments, e.g., involving SU-8 LIGA-like and techniques such as MEMS are also contemplated to be within the scope of the instant invention. With silicon wafers up to 30 cm diameter, more than 200 of the 1.5 cm×2 cm ladder circuits may be formed on a single wafer.

Figure 15:
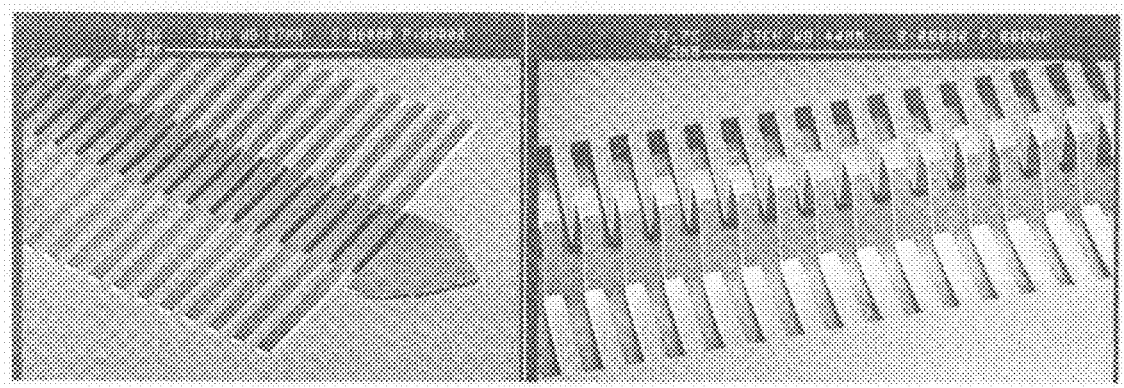
FIG. 15 illustrates two scanning electron microscope (SEM) photographs of exemplary micro-fabricated tunnel ladder SWS embodiments according to the present invention.

FIG. 15 illustrates two scanning electron microscope (SEM) photographs of exemplary micro-fabricated tunnel ladder SWS embodiments according to the present invention. The left image of FIG. 15 shows copper grown up around SU-8 features as in FIG. 14(d). The right image FIG. 15 shows top half of ladder after removal of SU-8 and silicon as in FIG. 14(e).

An embodiment of a TWT including a tunnel ladder SWS is also disclosed. An exemplary electron beam source for the micro-fabricated tunnel ladder circuit may include either a thermionic cathode or a field emitter array (FEA) cathode with associated integrated field effect transistors (FETs) to individually control the current for each emitter tip. Using the FETs prevents damage due to excess current and assures uniform emission current density over the cathode surface.

After launching losses and circuit losses are accounted for, a 2 cm section of an embodiment of a tunnel ladder circuit in a severless, vacuum power booster configuration produces >20 dB gain. Together with a solid state amplifier front end, and embodiment of this configuration produces a very compact millimeter wave power module (MMPM).

Figure 16A:
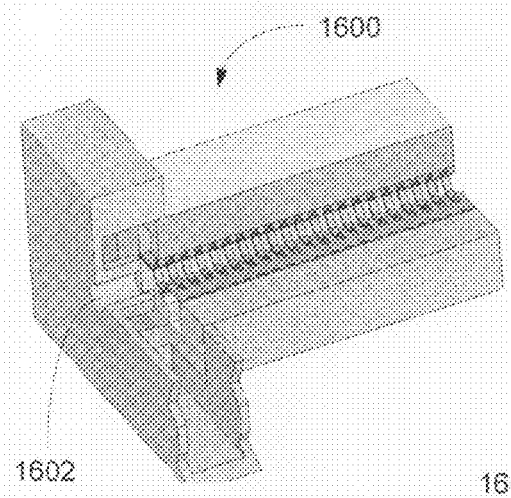
FIGS. 16A and 16B illustrates isometric and sectioned views of a waveguide coupler and its two tuning elements (capacitive post and inductive iris) according to embodiments of the present invention.
Figure 16B:
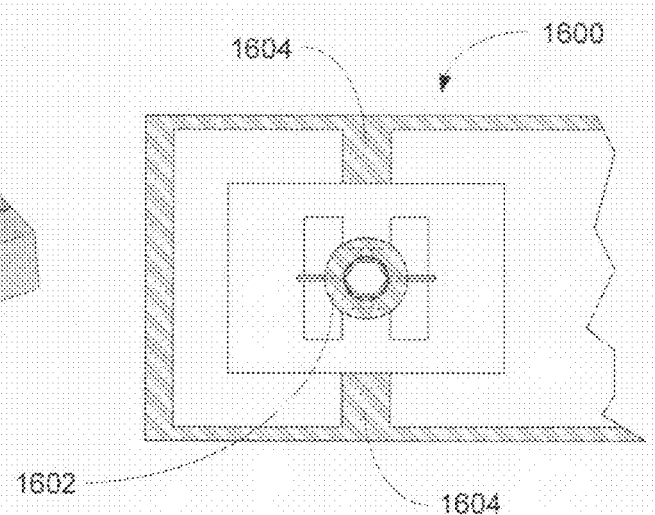

FIGS. 16A and 16B illustrate isometric and sectioned views, respectively, of a waveguide coupler 1600 and its two tuning elements, capacitive post 1602 and inductive iris 1604 FIG. 16B, according to embodiments of the present invention.

Figure 17:
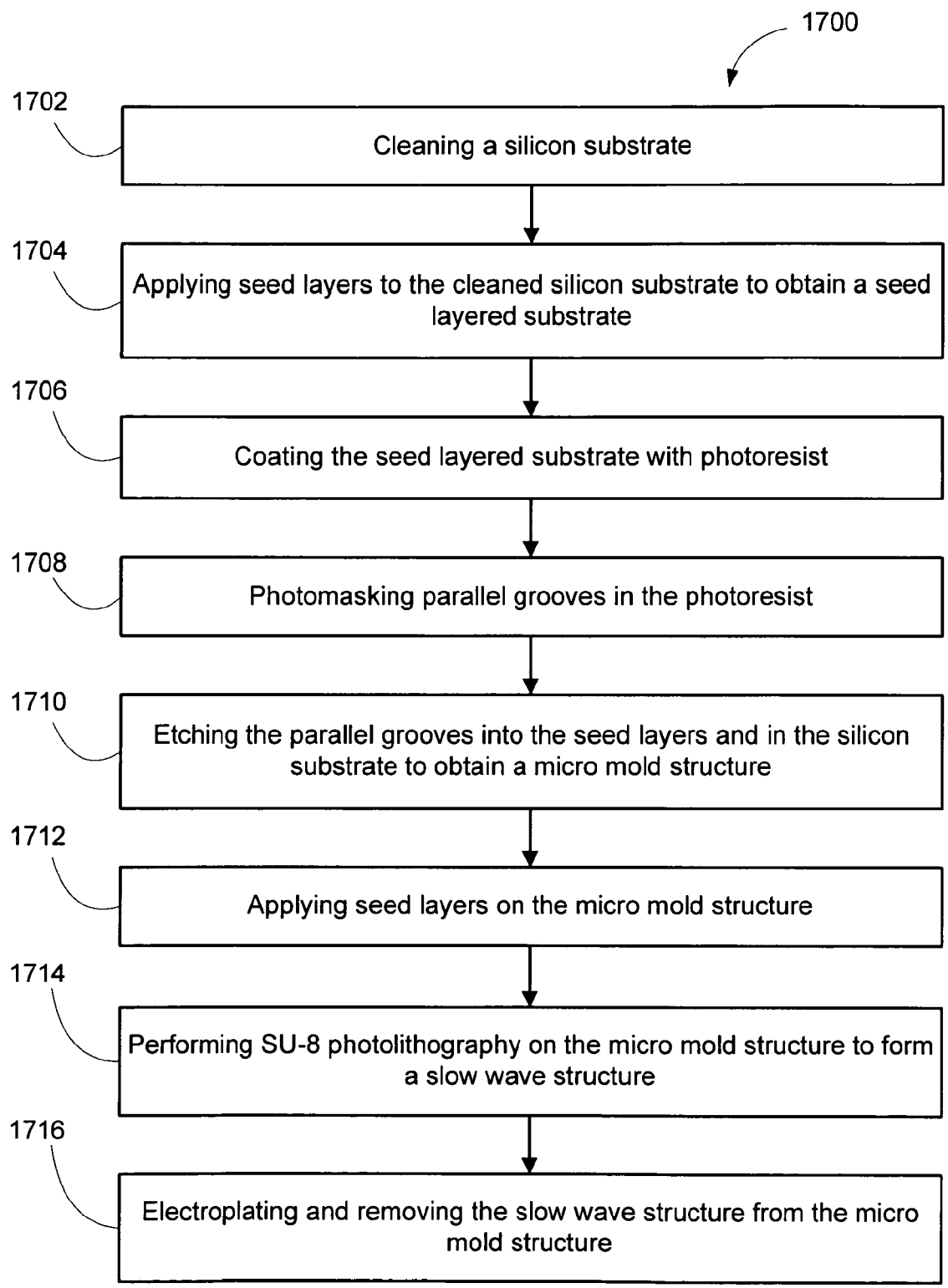
FIG. 17 illustrates a flow chart of an embodiment of a method of micro-fabricating a tunnel ladder slow wave structure.

FIG. 17 illustrates a flow chart of an embodiment of a method 1700 of micro-fabricating a tunnel ladder slow wave structure. Method 1700 may include the steps of cleaning a silicon substrate 1702 and applying seed layers to the cleaned silicon substrate to obtain a seed layered substrate 1704. Method 1700 may further include the steps of coating the seed layered substrate with photoresist 1706 and photomasking parallel grooves in the photoresist 1708. Method 1700 may further include the steps of etching the parallel grooves into the seed layers and in the silicon substrate to obtain a micro mold structure 1710. Method 1700 may further include the steps of applying seed layers on the micro mold structure 1712 and performing SU-8 photolithography on the micro mold structure to form a slow wave structure 1714. Method 1700 may further include the steDs of electroplating and removing the slow wave structure from micro mold structure 1716.

An alternative fabrication to that described in the above example may be successfully employed to make a precise dual ladder tunnel. A silicon substrate is etched, as described above, to form two parallel troughs with truncated triangular cross-sections. This substrate is then used as a female mold to make a companion male mold by coating the female mold with an appropriate release agent and filled with a curable material, e.g., a thermoset plastic, which is at least partially cured in place to a shape-retaining object which may then be further cured to form a rigid male mold with precise dimensions of the parallel ridges formed by the molding process.

The female mold and male mold may each be coated with a thin layer of copper by sputtering, evaporation, electrodeposition or similar means. The copper coating may be over a chromium base layer, as described in the above example. Clearly, other materials are also suitable for use as the base layer.

A dual-ladder integral structure of copper may be formed on a flat silicon substrate in a manner such as that described above with a hinge line equidistant between the two ladders. The ladders may be removed by, for example, dissolving, or etching a sacrificial layer located, for example, at the appropriate place between the ladders and the silicon substrate.

The dual ladders in a flat conformation are then aligned on the copper-clad female mold and then formed to shape by forcing the copper-clad male mold (die) into the female mold. The dual ladder structure may then be folded along its hinge line to superpose one ladder precisely above the other to form an electron beam focusing structure.

A certain level of care must be exercised to position the flat dual-ladder structure so that its hinge line is equidistant between the parallel troughs of the female mold. Various alignment techniques may be employed for this purpose such as a very thin laser beam which identifies the mold equidistant axis and the hinge line, which may include preparations in the flat dual-ladder structure in then vertically aligned visually through a magnification lens with the laser beam or, for example, by using precise alignment holes and pins.

An advantage of the present technique in comparison with that described in the above examples is that the precise formed silicon female mold may be used repeatedly. The resulting tunnel ladder in each instance has a hexagonal cross-section.

A tunnel ladder with a round cross section may be formed from a flat dual ladder structure by folding the dual ladder structure about its hinge line over a cylindrical mandrel which is spaced a precise distance from the hinge line. A series of cylindrical mandrels may be used for this purpose starting with a first small diameter mandrel in the first folding operation, then substituting successive mandrels with ever increasing diameters until the final material diameter of the tunnel ladder structure is achieved.

Such folding operations could be achieved in a series of stations with mandrels of increasing diameter associated with companion female dies of increasing diameters used to press the ladder rungs about the cylindrical mandrels.

Although all of the operations could be achieved by first making a single ladder-structure, a number of advantages accrue from first fabricating a dual ladder structure with an equidistant hinge axis. The hinge line may comprise a thinner thickness or aligned perforation or the like.

It is, of course, desirable to form a plurality of dual-ladder structures in one operation, where such structures are formed on a dual trough or flat substrate in end-to-end configuration. Thus, up to ten or more precisely formed dual ladders with a precisely formed hinge line may be simultaneously formed. Each dual ladder structure may then be separated from its following dual ladder structure or all operations of forming may be completed before the individual dual-ladder structures are separated.

Figure 18:
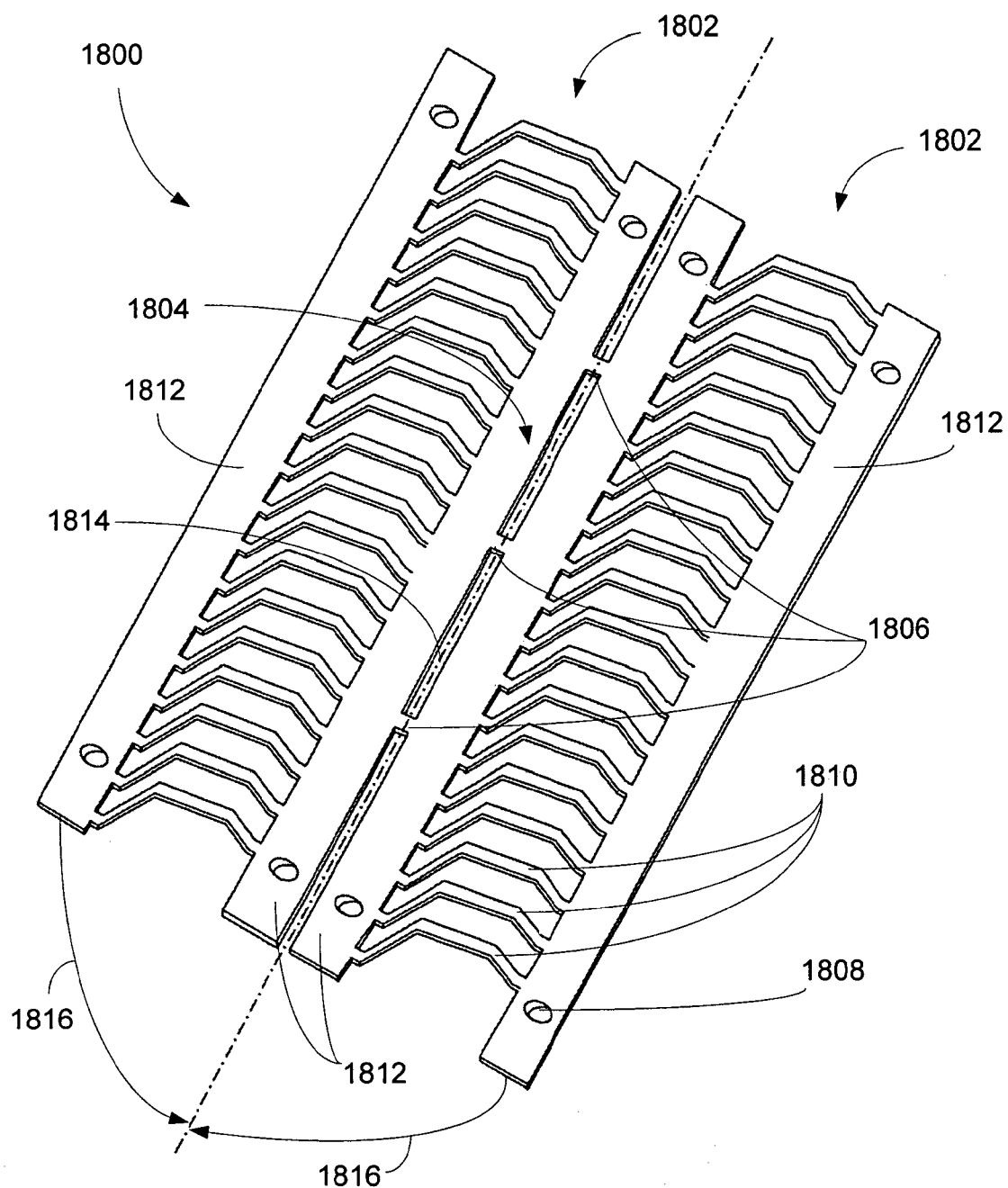
FIG. 18 illustrates a perspective view of a helix structure for a hexagonal helical tunnel ladder SWS formed according to a method of the present invention.
Figure 19:
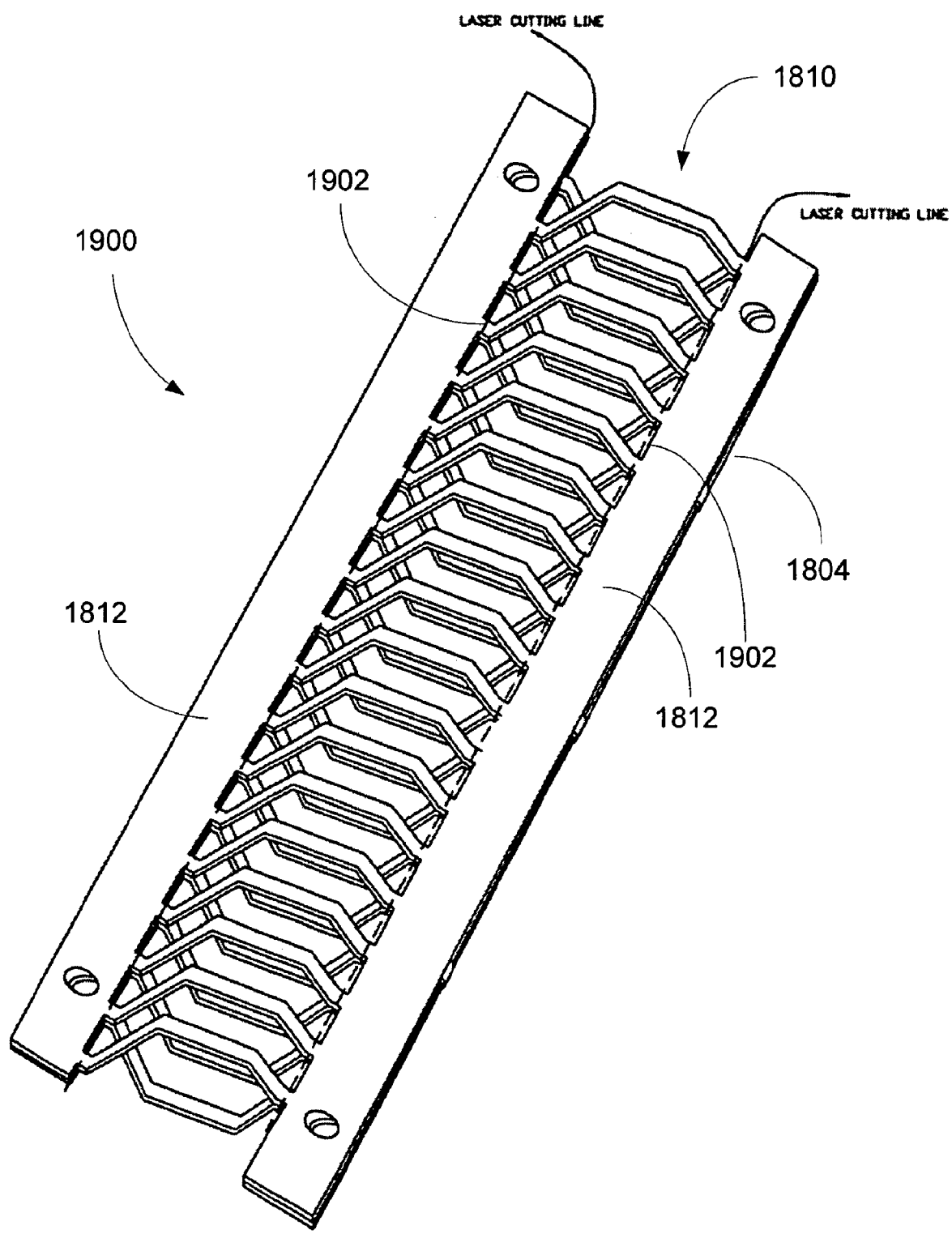
FIG. 19 illustrates a folded helix structure resulting from folding along hinge and joining the two halves according to an embodiment of the present invention.
Figure 20:
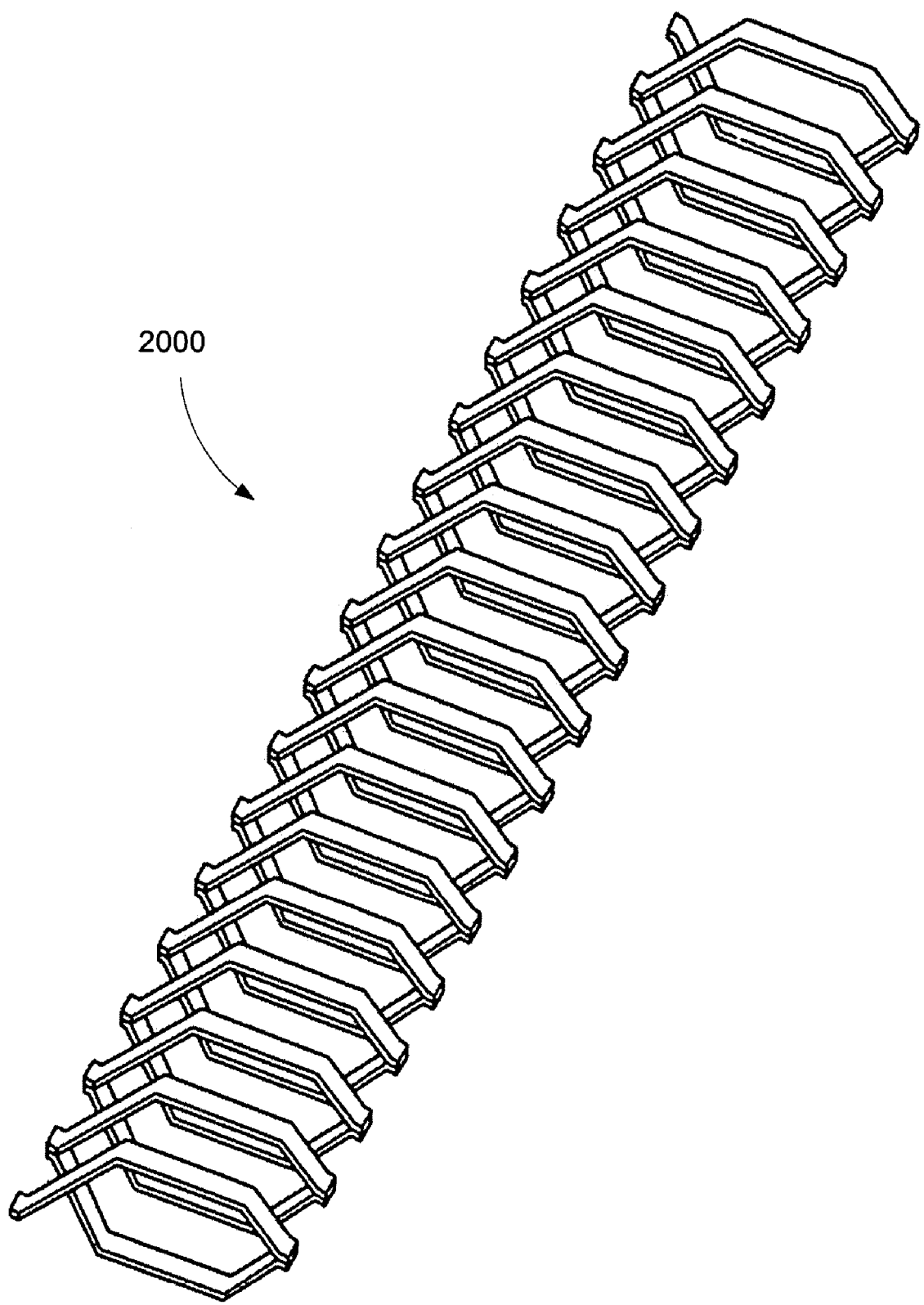
FIG. 20 illustrates hexagonal helical SWS after trimming of the joint areas according to an embodiment of the present invention.

Referring now to FIGS. 18-20, a method of forming a helical tunnel ladder SWS 2000 is disclosed. FIG. 18 illustrates a perspective view of a helix structure 1800 for a hexagonal helical SWS 2000 formed according to a method of the present invention. While FIG. 18 illustrates a hexagonal cross-sectioned helical SWS, any other suitable cross-section may be used consistent with the present invention. For example and not by way of limitation, circular, square, hexagonal, octagonal and polygonal shaped cross-sections may be used with the helix structure 1800 of the present invention. Helix structure 1800 may include two halves 1802 joined by a hinge 1804 formed by bridges 1806 or other suitable folding, bending, distorting or breakable mechanical structure. The centerline 1814 of the hinge 1804 is shown as a dot-dash line in FIG. 18. The two halves 1802 are folded along hinge 1804 or centerline 1814 as indicated by the curved arrows 1816 in FIG. 18. Helix structure 1800 may also include registration pin-holes 1808 in elongated joint areas 1812 for use in aligning the two halves 1802 prior to joining the two halves 1802. Joining of the two halves 1802 may be accomplished by brazing, welding, diffusion bonding or any other suitable means for assembling the two halves 1802 to form a hexagonal helical SWS. Each half 1802 may include a plurality of semi-hexagonal helical rungs 1810 supported by elongated joint areas 1812.

FIG. 19 illustrates a folded helix structure 1900 resulting from folding along hinge 1804 and joining the two halves 1802 of FIG. 18 according to an embodiment of the present invention. Folded helix structure 1900 is shown with laser cutting lines 1902, shown in FIG. 19 as dotted lines. The folded helix structure 1900 may include elongated joint areas 1812 along the edge of the flanges formed by the plurality of semi-hexagonal helical rungs 1810. According to another embodiment of the present invention, the elongated joint areas 1812 may be removed by laser trimming, electrical discharge method, or any other suitable method consistent with the instant invention. Thus, the laser cutting lines 1902 shown in FIG. 19 may be used with any suitable method of removing the elongated joint areas 1812.

FIG. 20 illustrates a hexagonal helical SWS 2000 after trimming of the elongated joint areas 1812 according to an embodiment of the present invention. As noted above, hexagonal helical SWS 2000 may or may not include joint areas as shown in FIGS. 19 and 20. Of course it is understood that any suitable shape and not just a hexagonal shape can be used in the instant invention disclosed herein. For example, circular, square, rectangular, octagonal, polygonal of any degree and any other such shape that is suitable are also considered to be within the scope of the present invention.

While the foregoing advantages of the present invention are manifested in the illustrated embodiments of the invention, a variety of changes can be made to the configuration, design and construction of the invention to achieve those advantages. Hence, reference herein to specific details of the structure and function of the present invention is by way of example only and not by way of limitation.

What is claimed is:

1. A method of micro-fabricating a helical slow wave structure, comprising:
   providing a hollow preform of a preselected material;
   coating the hollow preform with photoresist;
   winding a wire coil around the photoresist coated hollow preform;
   exposing the wire coil wound photoresist coated hollow preform to obtain a photoresist pattern;
   removing the wire coil;
   developing the photoresist pattern;
   removing exposed preform material according to the photoresist pattern; and
   stripping any remaining photoresist to obtain a helical slow wave structure.

2. The method according to claim 1, further comprising polishing the slow wave structure.

3. The method according to claim 2, further comprising electroplating the polished slow wave structure.

4. The method according to claim 1, wherein providing the hollow preform comprises providing a hollow preform having one of the following cross-sections:
   circular, square, hexagonal, octagonal or polygonal.

5. The method according to claim 1, wherein providing the hollow preform of a preselected material comprises providing a hollow preform comprising one of: copper, molybdenum, tungsten, tantalum, nickel, and alloys containing these metals.

6. The method according to claim 1, wherein providing the hollow preform of a preselected material comprises providing a hollow preform comprising at of: copper, molybdenum, tungsten, nickel, tantalum, cobalt, iron, gold, platinum, and alloys containing these metals.

7. The method according to claim 1, wherein winding a wire coil around the photoresist coated hollow preform comprises winding a wire coil having a cross-section selected from the group consisting of flat, round, rectangular, square and oval.

8. The method according to claim 1, wherein winding a wire coil around the photoresist coated hollow preform comprises winding a wire coil comprising one of copper, aluminum or stainless steel.

* * * * *